(12) United States Patent
Komatsu et al.

(10) Patent No.: US 10,304,740 B2
(45) Date of Patent: May 28, 2019

(54) RAMO4 MONOCRYSTALLINE SUBSTRATE (71) Applicant: Panasonic Intellectual Property Management Co., Ltd., Osaka (JP)

(72) Inventors: Shinsuke Komatsu, Osaka (JP); Yoshio Okayama, Osaka (JP); Masaki Nobuoka, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/825,035

(22) Filed: Nov. 28, 2017

(65) Prior Publication Data
US 2018/0174911 A1 Jun. 21, 2018

(30) Foreign Application Priority Data

Dec. 15, 2016 (JP) .................................. 2016-243430
Sep. 12, 2017 (JP) .................................. 2017-174893

(51) Int. Cl.
*H01L 33/00* (2010.01)
*H01L 21/02* (2006.01)
(Continued)

(52) U.S. Cl.
CPC ...... *H01L 21/7813* (2013.01); *C01F 17/0025* (2013.01); *C30B 25/18* (2013.01); *C30B 29/403* (2013.01); *H01L 21/0254* (2013.01); *H01L 21/02428* (2013.01); *H01L 33/007* (2013.01); *C30B 29/22* (2013.01); *H01S 5/0211* (2013.01)

(58) Field of Classification Search
CPC ... H01L 33/007; H01L 21/0242; C30B 29/22; H01S 5/0211
See application file for complete search history.

(56) References Cited

U.S. PATENT DOCUMENTS 5,530,267 A * 6/1996 Brandle, Jr. ........ H01L 31/1852
257/76
5,700,732 A * 12/1997 Jost .......................... G03F 7/70
148/DIG. 102

(Continued)

FOREIGN PATENT DOCUMENTS

JP 2015-178448 10/2015

*Primary Examiner* — Ida M Soward
(74) *Attorney, Agent, or Firm* — McDermott Will & Emery LLP (57) ABSTRACT

An $RAMO_4$ substrate that includes an $RAMO_4$ monocrystalline substrate formed of a single crystal represented by general formula $RAMO_4$, wherein R represents one or more trivalent elements selected from the group consisting of Sc, In, Y, and lanthanoid elements, A represents one or more trivalent elements selected from the group consisting of Fe(III), Ga, and Al, and M represents one or more divalent elements selected from the group consisting of Mg, Mn, Fe(II), Co, Cu, Zn, and Cd. The $RAMO_4$ monocrystalline substrate has a principal surface with a plurality of grooves. The principal surface has an off-angle θ with respect to a cleaving surface of the single crystal. The $RAMO_4$ monocrystalline substrate satisfies tan θ ≤ Wy/Wx, where Wx is the width at the top surface of a raised portion between the grooves, and Wy is the height of the raised portion.

6 Claims, 8 Drawing Sheets

(51) Int. Cl.
  *C30B 29/22* (2006.01)
  *H01L 21/78* (2006.01)
  *C30B 29/40* (2006.01)
  *C30B 25/18* (2006.01)
  *C01F 17/00* (2006.01)
  *H01S 5/02* (2006.01)

(56) References Cited

U.S. PATENT DOCUMENTS

| | | | |
|---|---|---|---|
| 8,729,559 B2 * | 5/2014 | Krames | C30B 25/186 257/14 |
| 9,068,279 B2 * | 6/2015 | Jiunn-Yih | B82Y 30/00 |
| 2010/0107969 A1 * | 5/2010 | Kuraoka | C30B 23/02 117/68 |
| 2012/0111264 A1 * | 5/2012 | Shimodaira | C30B 9/10 117/78 |
| 2014/0264429 A1 * | 9/2014 | Higashihara | C30B 19/02 257/103 |
| 2017/0073840 A1 * | 3/2017 | Mori | C30B 19/02 |
| 2017/0317237 A1 * | 11/2017 | Gardner | H01L 33/007 |
| 2018/0068849 A1 * | 3/2018 | Matsuoka | C23C 16/34 |

* cited by examiner

*Related Art*

FIG. 3B

*Related Art*

FIG. 4A

*Related Art*

FIG. 4B

*Related Art*

RAMO4 MONOCRYSTALLINE SUBSTRATE

TECHNICAL FIELD

The present disclosure relates to a $RAMO_4$ substrate, and a method for producing group III nitride crystals using same.

BACKGROUND

Figure 1:
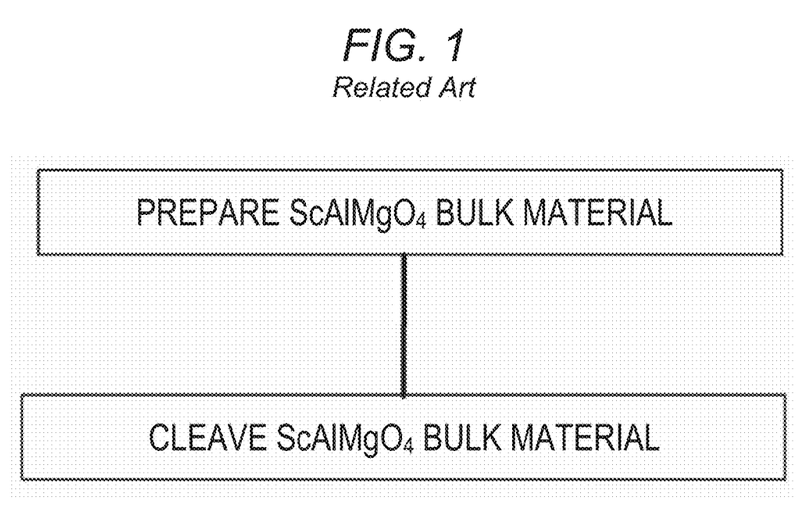
FIG. 1 is an explanatory diagram representing a method for producing a $ScAlMgO_4$ substrate.

A $ScAlMgO_4$ substrate is a known example of a $RAMO_4$ substrate formed of a single crystal represented by general formula $RAMO_4$ (wherein R represents one or more trivalent elements selected from the group consisting of Sc, In, Y, and lanthanoid elements, A represents one or more trivalent elements selected from the group consisting of Fe(III), Ga, and Al, and M represents one or more divalent elements selected from the group consisting of Mg, Mn, Fe(II), Co, Cu, Zn, and Cd. For example, a $ScAlMgO_4$ substrate is used as a growth substrate for nitride semiconductors such as GaN (see, for example, JP-A-2015-178448). FIG. 1 shows an example of a method for producing the traditional $ScAlMgO_4$ substrate described in this related art. As shown in FIG. 1, the traditional $ScAlMgO_4$ substrate is produced by a method that includes preparing a $ScAlMgO_4$ bulk material, and cleaving the $ScAlMgO_4$ bulk material.

Here, when a $RAMO_4$ substrate is used as a seed substrate for producing a group III nitride crystal, a crystal of a group III nitride is grown on an epitaxial growth surface of the $RAMO_4$ substrate. After being produced, the group III nitride crystal is separated from the $RAMO_4$ substrate by taking advantage of the cleavability of the $RAMO_4$ substrate. In this way, the method enables producing a sole group III nitride crystal. The group III nitride crystal can then be used for luminescent devices such as LEDs and lasers, and power devices such as power supplies.

SUMMARY

It is difficult to sufficiently separate the group III nitride crystal from the $RAMO_4$ substrate by simply taking advantage of the cleavability of the substrate as in the traditional $RAMO_4$ substrate. Failure to sufficiently separate the group III nitride crystal causes damage to the product group III nitride crystal, and the quality of the group III nitride crystal is often unsatisfactory. This has created a demand for a $RAMO_4$ substrate or means by which a quality group III nitride crystal can be obtained.

The present disclosure is intended to provide a $RAMO_4$ substrate having improved quality.

Provided in the present disclosure is a $RAMO_4$ substrate including a $RAMO_4$ monocrystalline substrate formed of a single crystal represented by general formula $RAMO_4$ (wherein R represents one or more trivalent elements selected from the group consisting of Sc, In, Y, and lanthanoid elements, A represents one or more trivalent elements selected from the group consisting of Fe(III), Ga, and Al, and M represents one or more divalent elements selected from the group consisting of Mg, Mn, Fe(II), Co, Cu, Zn, and Cd), the $RAMO_4$ monocrystalline substrate having a principal surface with a plurality of grooves, the principal surface having an off-angle $\theta$ with respect to a cleaving surface of the single crystal, the $RAMO_4$ monocrystalline substrate satisfying $\tan\theta \leq Wy/Wx$, where Wx is the width at the top surface of a raised portion between the grooves, and Wy is the height of the raised portion.

The present disclosure has enabled providing an $RAMO_4$ substrate having improved quality.

DESCRIPTION OF EMBODIMENTS

An embodiment of the present disclosure is described below with reference to the accompanying drawings. The embodiment described is a $ScAlMgO_4$ substrate as an exemplary example of an $RAMO_4$ substrate.

The following first describes the findings that led to the present disclosure. A $ScAlMgO_4$ single crystal has a structure in which a rock salt (111) planar $ScO_2$ layer, and a hexagonal (0001) planar $AlMgO_2$ layer are alternately laminated. Two hexagonal (0001) planar layers are more planar than the wurtzite-form structure, and the vertical interlayer bond is longer than the in-plane bond by a length of about 0.03 nm, and is weaker than in-plane bonding. This allows the $ScAlMgO_4$ single crystal to be cleaved at the (0001) plane. By taking advantage of this characteristic, a bulk material can be cut by cleavage to prepare a plate-shaped seed substrate ($ScAlMgO_4$ monocrystalline substrate) for the production of, for example, a group III nitride crystal. When using such a seed substrate, the group III nitride crystal grown on the seed substrate ($ScAlMgO_4$ monocrystalline substrate) can be separated from the seed substrate by taking advantage of the easily cleavable nature of the ScAlMgO$_4$ single crystal.

Figure 2:
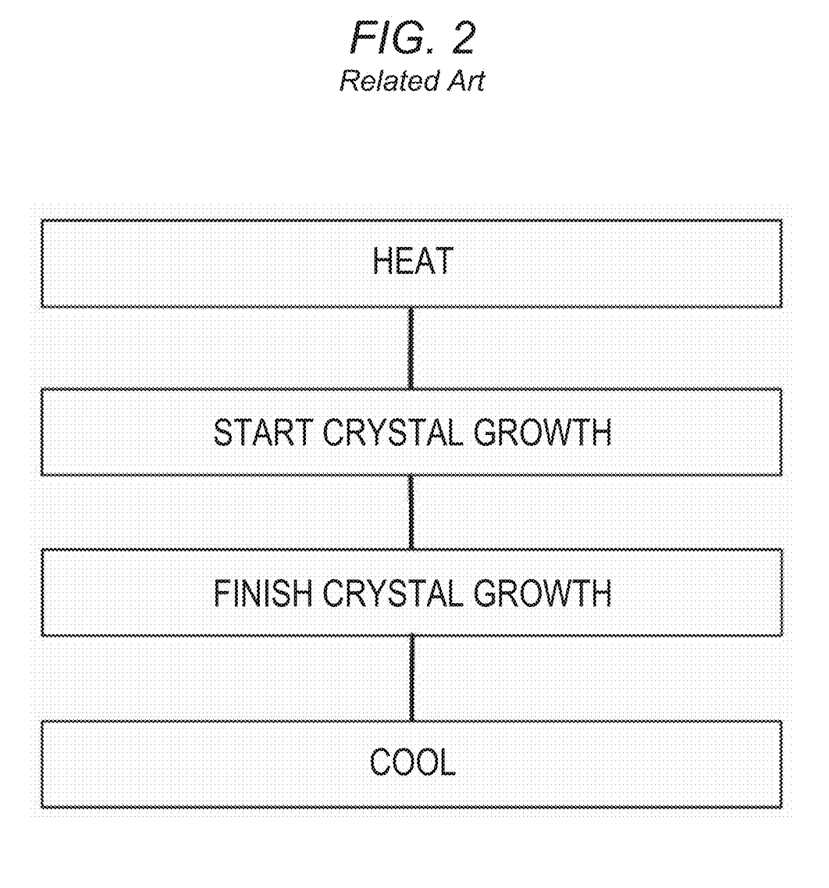
FIG. 2 is an explanatory diagram representing a method for growing a group III nitride crystal using the $ScAlMgO_4$ substrate.
Figure 3A:
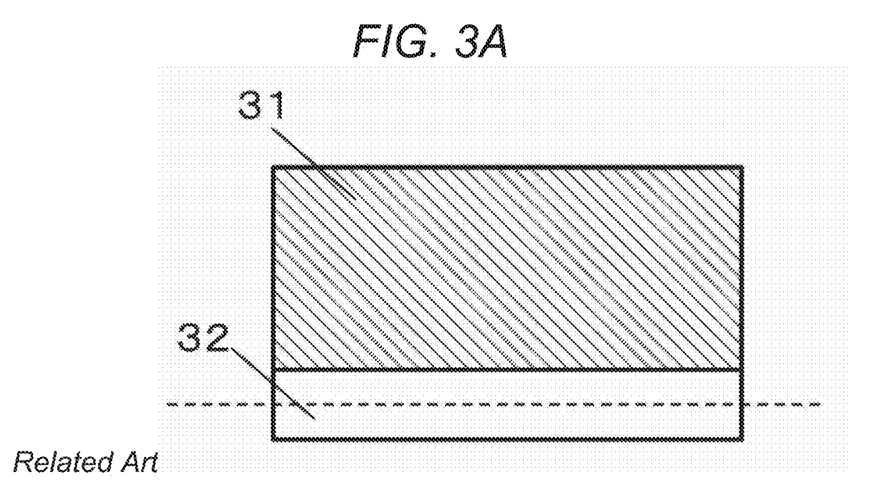
FIG. 3A is an explanatory diagram showing a form of a traditional $ScAlMgO_4$ monocrystalline substrate after the production of a group III nitride crystal.
Figure 3B:
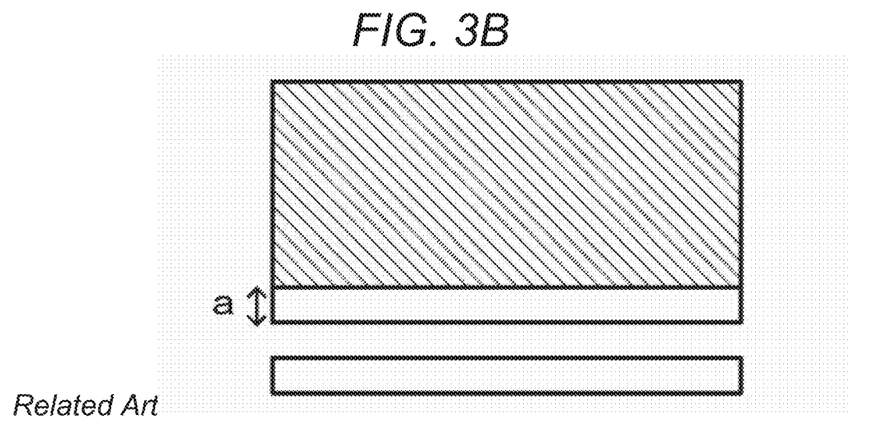
FIG. 3B is an explanatory diagram showing a form of the $ScAlMgO_4$ monocrystalline substrate after the group III nitride crystal was detached.

The following describes the challenges involved in the production of a group III nitride crystal using the ScAlMgO$_4$ single crystal as a seed substrate. FIG. 2 shows an explanatory diagram of a group III nitride crystal producing method. For the production of a group III nitride crystal, a ScAlMgO$_4$ monocrystalline substrate is placed in a crystal growth device, and heated. The final temperature of heating is appropriately selected, and is typically 900 to 1,400° C. Inside the heated crystal growth device, crystals of group III nitride grow on the ScAlMgO$_4$ monocrystalline substrate. FIG. 3A shows a cross sectional view of a structure of a group III nitride crystal 31 grown on a traditional ScAlMgO$_4$ monocrystalline substrate 32. The diagram shows the state after the group III nitride crystal 31 has grown several hundred micrometers to several millimeters on the ScAlMgO$_4$ monocrystalline substrate 32. The 900 to 1,400° C. high-temperature process (crystal growth) is followed by a cooling process, which is performed to remove the group III nitride crystal 31 and other products from the crystal growth device. In the cooling process, the ScAlMgO$_4$ monocrystalline substrate 32, and the group III nitride crystal 31 experience strain stress due to the difference of linear coefficients of expansion. Here, it would be ideal if the group III nitride crystal 31 could naturally detach itself from the ScAlMgO$_4$ monocrystalline substrate 32. Such natural detachment should occur at the interface between these two layers because the ScAlMgO$_4$ single crystal 31 is more cleavable at the (0001) plane (horizontal direction in FIG. 3A). In reality, however, the cleavability of the ScAlMgO$_4$ monocrystalline substrate 32 is so strong that detachment is more likely to occur at the cleaving surface of the ScAlMgO$_4$ monocrystalline substrate 32, rather than the interface between the group III nitride crystal 31 and the ScAlMgO$_4$ monocrystalline substrate 32, as shown in FIG. 3B. Here, the thickness a of the ScAlMgO$_4$ single crystal remaining on the group III nitride crystal 31 is about several ten micrometers to several hundred micrometers (see FIG. 3B). As a result, residual stress occurs in the structure including the group III nitride crystal 31, and causes warping or cracking in the group III nitride crystal 31.

Figure 4A:
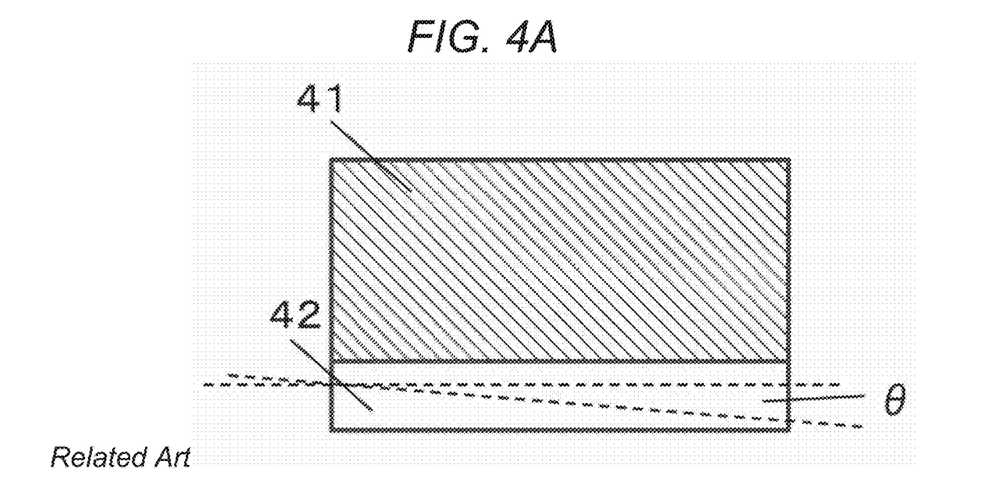
FIG. 4A is an explanatory diagram showing a form of a traditional $ScAlMgO_4$ monocrystalline substrate having an off-angle $\theta$ after the production of a group III nitride crystal.

There are also cases where an off-angle is given to the ScAlMgO$_4$ monocrystalline substrate. An off-angle is a small angle created by the cleaving surface ((0001) plane) and the epitaxial growth surface (the principal surface) of the ScAlMgO$_4$ single crystal. For example, as shown in FIG. 4A, a ScAlMgO$_4$ monocrystalline substrate 42 may be produced so that the principal surface of the ScAlMgO$_4$ monocrystalline substrate 42 has an off-angle θ with respect to the cleaving surface ((0001) plane) of the ScAlMgO$_4$ single crystal. The ScAlMgO$_4$ monocrystalline substrate 42 having such an off-angle θ can be obtained by pre-treating the ScAlMgO$_4$ single crystal by processes such as machining, chemical processing, a laser process, and a discharge process.

Figure 4B:
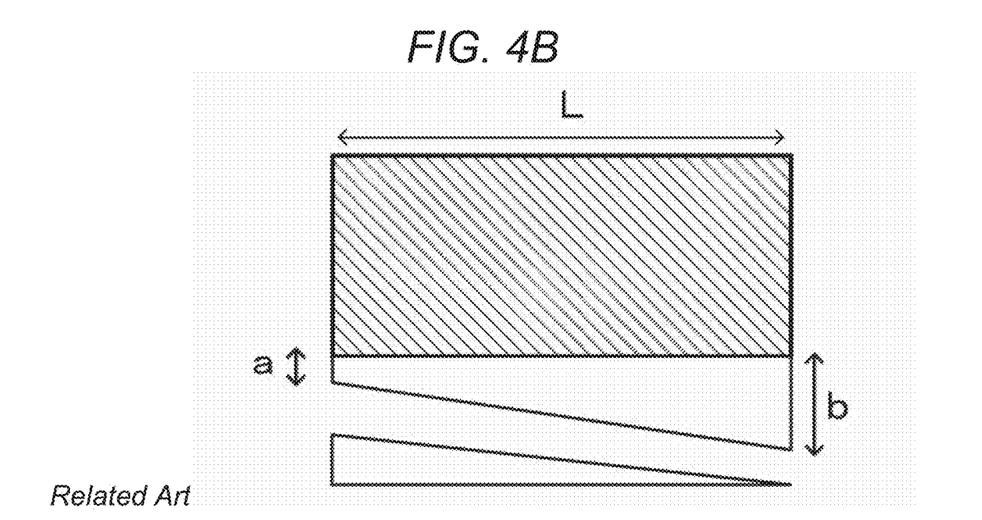
FIG. 4B is an explanatory diagram showing a form of the $ScAlMgO_4$ monocrystalline substrate after the group III nitride crystal was detached.

When the group III nitride crystal is epitaxially grown on the seed substrate ScAlMgO$_4$ single crystal having an off-angle θ in the manner shown in FIG. 2, detachment also occurs at the cleaving surface of the ScAlMgO$_4$ monocrystalline substrate 42 upon cooling. That is, detachment occurs with an angle θ with respect to the epitaxial growth surface, as shown in FIG. 4B. This makes the remaining thickness of the ScAlMgO$_4$ single crystal on the group III nitride crystal 41 nonuniform, compared to when θ=0° as in the case of FIG. 3B. Specifically, the thickness of the ScAlMgO$_4$ single crystal becomes thicker from thickness a to thickness b along the slope of the detaching surface having the off-angle θ. That is, when the principal surface of the ScAlMgO$_4$ monocrystalline substrate 42 has an off-angle θ with respect to the cleaving surface, the group III nitride crystal experiences a larger residual stress than when the off-angle θ=0° as shown in FIG. 3B, and warping and cracking become more prominent. The ScAlMgO$_4$ single crystal of a nonuniform thickness remaining on the back surface of the group III nitride crystal 41 is also problematic in that it makes polishing of the back surface difficult. Thickness b can be represented by L×tan θ, where L is the diameter of the ScAlMgO$_4$ single crystal.

Detachment at the cleaving surface with an off-angle θ also becomes a problem when reusing the ScAlMgO$_4$ monocrystalline substrate. If naturally detached, the ScAlMgO$_4$ monocrystalline substrates 32 and 42 should be reusable as seed substrates. When detachment occurs with θ=0° as shown in FIG. 3B, the detached ScAlMgO$_4$ single crystal can be reused with ease after processing. However, a substantial portion of the ScAlMgO$_4$ single crystal remains on the group III nitride crystal when it detaches itself at the cleaving surface having an off-angle θ as shown in FIG. 4B. The surface of the detached ScAlMgO$_4$ monocrystalline substrate 42 also has the angle θ with respect to the desired epitaxial growth surface. This makes processing of the ScAlMgO$_4$ monocrystalline substrate 42 difficult as compared to the case shown in FIG. 3B (when there is no off-angle θ), with the result that a smaller portion of the ScAlMgO$_4$ monocrystalline substrate 42 can be reused.

This becomes more problematic with large off-angles θ, or when the size of the group III nitride crystal becomes larger. For example, when θ=0.8°, L=150 mm, and a=100 μm in the ScAlMgO$_4$ monocrystalline substrate 42 shown in FIG. 4B, b becomes approximately equal to 2.1 mm, and the ScAlMgO$_4$ monocrystalline substrate 42 cannot be reused as a seed substrate even when it has a thickness of 2.2 mm.

The ScAlMgO$_4$ substrate of the present embodiment addresses these drawbacks by disposing a plurality of grooves in the principal surface (epitaxial growth surface) of a ScAlMgO$_4$ monocrystalline substrate. In the ScAlMgO$_4$, group III nitride crystals form on the raised portions between the grooves of the ScAlMgO$_4$ monocrystalline substrate. With the ScAlMgO$_4$ substrate of the present embodiment, the ScAlMgO$_4$ single crystal that remains on the group III nitride crystal can have a considerably smaller thickness when the group III nitride crystal is separated from the ScAlMgO$_4$ substrate (ScAlMgO$_4$ monocrystalline substrate) by cooling using the difference of the linear coefficients of expansion. This makes it possible to efficiently produce a quality group III nitride crystal that involves little residual stress.

The ScAlMgO$_4$ substrate of the present embodiment may be solely a ScAlMgO$_4$ monocrystalline substrate 51, or may have a group III nitride seed crystal layer (hereinafter, also referred to as "seed layer"; will be described later) 71 on the raised portions between grooves of the ScAlMgO$_4$ monocrystalline substrate 51.

Figure 5A:
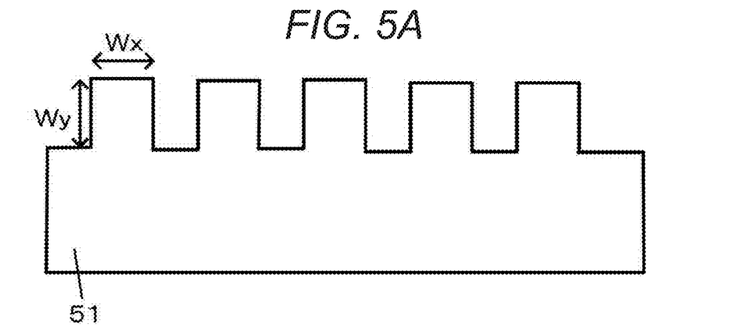
FIG. 5A shows a cross sectional view of a $ScAlMgO_4$ monocrystalline substrate having a plurality of grooves according to an embodiment.
Figure 5B:
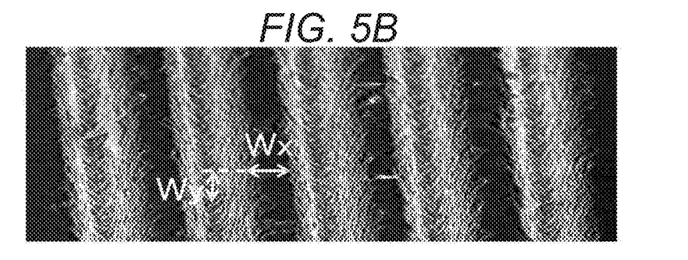
FIG. 5B shows a SEM image of the $ScAlMgO_4$ monocrystalline substrate according to the embodiment.
Figure 5C:
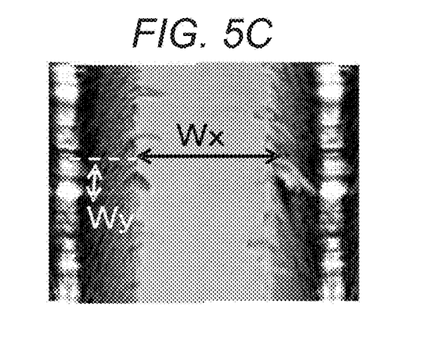
FIG. 5C shows a partially magnified view of FIG. 5B.

FIG. 5A shows a cross sectional view of the ScAlMgO$_4$ monocrystalline substrate 51 having a plurality of grooves. The ScAlMgO$_4$ monocrystalline substrate 51 has periodically formed grooves (recessed portions), and the regions between the grooves define raised portions. FIGS. 5B and 5C show SEM images of the actual grooves (recessed portions and raised portions) formed in a surface of the ScAlMgO$_4$ monocrystalline substrate 51 according to the embodiment. In the present embodiment, the width at the top surface of the raised portions, specifically, the flat region at the top surface of each raised portion is Wx, and the height of the raised portions, specifically, the distance from the flat region of the recessed portion to the flat region of the raised portion is Wy. When the raised portion has tapered or slanted side walls, Wx is the width of only the flat region at the top surface of the raised portion, and does not include the side walls. The raised portions shown in FIGS. 5B and 5C have a trapezoidal cross section. However, the raised portions may have other cross-sectional shapes, including a rectangle, and a square. The ScAlMgO$_4$ monocrystalline substrate shown in FIGS. 5B and 5C is configured so that the raised portions (a plurality of grooves) are in straight lines when viewed in plane. However, the raised portions (grooves) may have a curved shape as viewed in plane.

Figure 5D:
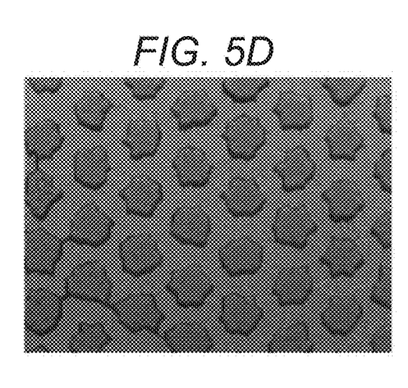
FIG. 5D shows a light micrograph of a $ScAlMgO_4$ monocrystalline substrate according to another embodiment.

As shown in FIG. 5D, the raised portions may be disposed as dots (in the form of islands) when viewed in plane. In this case, the width at the top surface of the raised portion (the width of the flat region at the top surface of the raised portion) is the maximum diameter of the raised portion. Here, the distance Wy is the distance from the flat region of the recessed portion to the flat region of the raised portion, as above.

The ScAlMgO$_4$ monocrystalline substrate of the present embodiment has an off-angle θ. The off-angle θ, Wx, and Wy satisfy the following formula (1).

$$\tan\theta \leq Wy/Wx \quad (1)$$

When the ScAlMgO$_4$ monocrystalline substrate having an off-angle θ has periodic grooves (raised portions and recessed portions) satisfying the relation represented by the formula (1), the ScAlMgO$_4$ monocrystalline substrate that remains on the group III nitride crystal after the group III nitride crystal is formed and detached can have a considerably small thickness. In the RAMO$_4$ substrate of the present embodiment, stress is applied to the raised portions upon cooling the group III nitride crystal produced. Accordingly, the cleavage of the ScAlMgO$_4$ monocrystalline substrate occurs at the raised portions. Here, when the raised portions are shaped to satisfy the formula (1), the cleavage does not extend beyond the raised portions, and detachment does not occur at the non-grooved regions (hereinafter, also referred to as "base portion") of the ScAlMgO$_4$ monocrystalline substrate. This makes it possible to minimize the detachment of the ScAlMgO$_4$ monocrystalline substrate.

Preferably, Wx, Wy, and θ satisfy 1 μm≤Wx≤360 μm, 0.36 μm≤Wy≤1,000 μm, and 0°<θ≤20°. Crystal planes of different orientations occur when the off-angle θ is excessively large. This tends to cause a mismatch at the interface, and the off-angle θ needs to be confined within the foregoing range. More preferably, 0.36 μm Wy 100 μm. The grooves can be formed by a quick laser process when Wy is 100 μm or less. When Wy exceeds 100 μm, variation may occur in Wx by the effect of the laser heat.

Particularly, Wx, Wy, and the off-angle θ will preferably satisfy 16.6 μm≤Wx≤301.1 μm, 0.88 μm≤Wy≤28.7 μm, and 0°<θ≤11.1°, as will be described in the evaluation results below. With these ranges, the epitaxial growth of a group III nitride on the ScAlMgO$_4$ monocrystalline substrate takes place more easily, and it becomes easier to obtain a substrate formed of a quality group III nitride crystal.

Figure 5E:
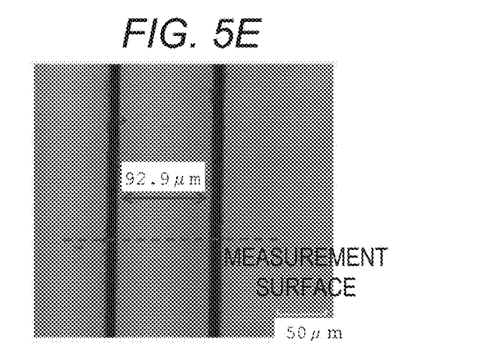
FIG. 5E is a light micrograph of a $ScAlMgO_4$ monocrystalline substrate according to yet another embodiment.
Figure 5F:
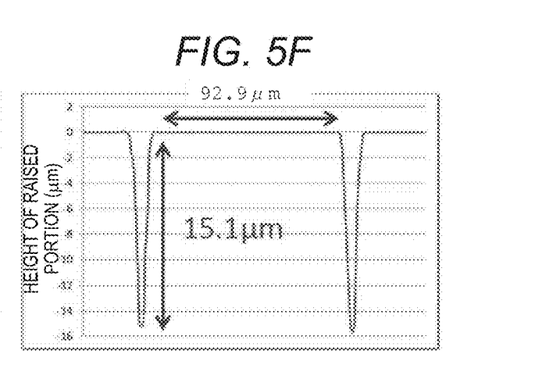
FIG. 5F shows the result of a cross sectional shape measurement of the $ScAlMgO_4$ monocrystalline substrate shown in FIG. 5E.
Figure 6:
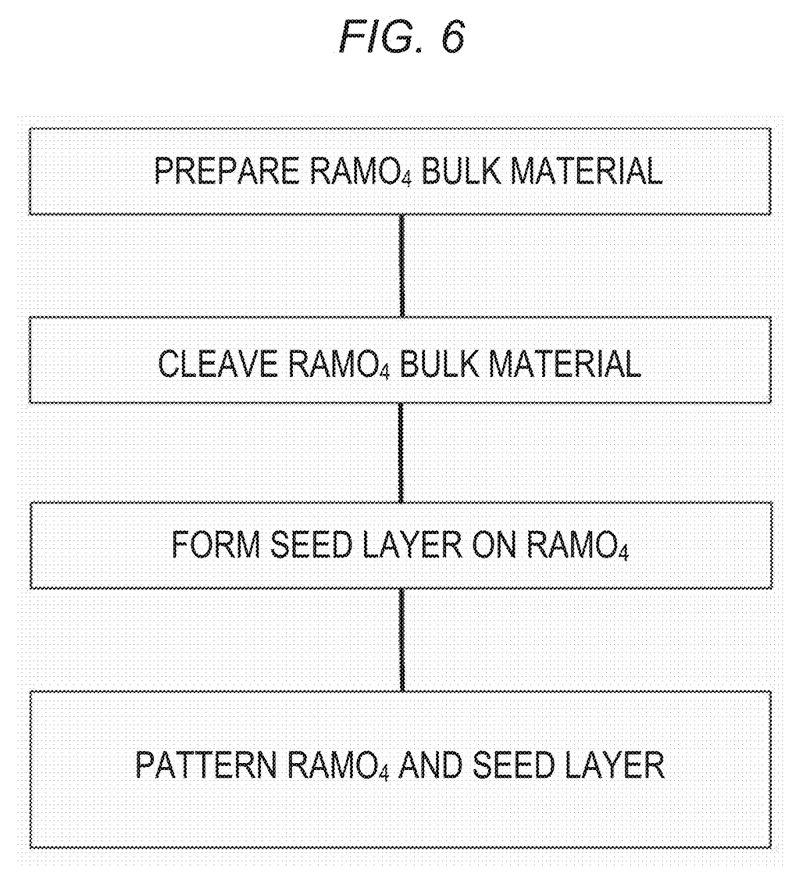
FIG. 6 is an explanatory diagram representing a method for producing the $ScAlMgO_4$ substrate having a plurality of grooves according to the embodiment.

A ScAlMgO$_4$ monocrystalline substrate having a predetermined off-angle (9.3° in this example) was prepared, and the Wx, Wy, and off-angle θ of the ScAlMgO$_4$ monocrystalline substrate, and the quality of the group III nitride crystal formed on the ScAlMgO$_4$ monocrystalline substrate were confirmed. A plurality of straight-line grooves (raised portions and recessed portions), as shown in FIG. 5E, was formed by processing the epitaxial growth surface of the ScAlMgO$_4$ monocrystalline substrate with a laser. The shape (Wx and Wy) of the grooves on the surface (measurement surface) orthogonal to the longitudinal direction of the grooves was specified as shown in FIG. 5E. FIG. 5F represents an example of the measurement result (the measurement result for Example 3 shown in Table 1).

The groove shape was specified with a non-contact, optical three-dimensional measurement device, such as a Mitaka Kohki NH3-SP for example (measurement resolution for flat surface: 0.01 μm, measurement resolution for height: 0.001 μm). Specifically, the measurement surface was scanned in a 1-μm pitch across the top surface of the raised portions, using a 50 times objective lens, and data regarding the shape of the raised and recessed portions were obtained.

Separately, a plurality of ScAlMgO$_4$ substrates was produced in the same manner as above, except that the off-angle θ, Wx, and Wy were varied as shown in the Table 1 below. Each ScAlMgO$_4$ substrate was then observed to confirm the quality of the group III nitride crystal formed on the raised portions. The group III nitride crystal had high quality in all examples. That is, a substrate having improved quality can be obtained when Wx, Wy, and θ satisfy 16.6 μm≤Wx≤301.1 μm, 0.88 μm≤Wy≤28.7 μm, and 0°<θ≤11.1°, respectively.

TABLE 1

|  | Off-angle θ (°) | tan θ | Wx (μm) | Wy (μm) | Wy/Wx |
|---|---|---|---|---|---|
| Example 1 | Within 3.0° | 0.052 | 16.6 | 0.88 | 0.053 |
| Example 2 | Within 11.1° | 0.196 | 21.4 | 4.19 | 0.196 |
| Example 3 | Within 9.2° | 0.162 | 92.9 | 15.1 | 0.163 |
| Example 4 | Within 1.3° | 0.023 | 95.0 | 2.2 | 0.023 |
| Example 5 | Within 5.4° | 0.095 | 301.1 | 28.7 | 0.095 |

Figure 7A:
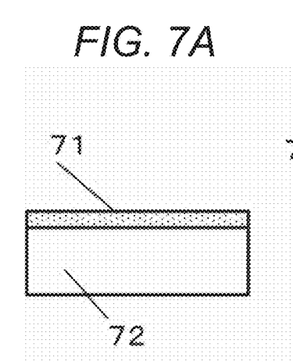
FIGS. 7A and 7B are diagrams representing the steps of producing a $ScAlMgO_4$ substrate.

The following describes an exemplary method of production of the ScAlMgO$_4$ substrate having a straight-line structure (grooves) in planar view as shown in FIG. 5A, with reference to FIG. 6, and FIGS. 7A to 7E. In this method, a bulk ScAlMgO$_4$ single crystal is produced first, as in the traditional ScAlMgO$_4$ monocrystalline substrate producing method. The ScAlMgO$_4$ monocrystalline substrate is then produced by taking advantage of the cleavability of the crystal. Here, the monocrystalline substrate needs to have a thickness larger than Wy. This is followed by formation of a seed layer 71 on a ScAlMgO$_4$ monocrystalline substrate 72, as shown in FIG. 7A. The seed layer 71 is a layer of group III nitride provided for epitaxial growth of group III nitride, and has a thickness of 500 nm to 10 μm.

Figures 7B, 7C:
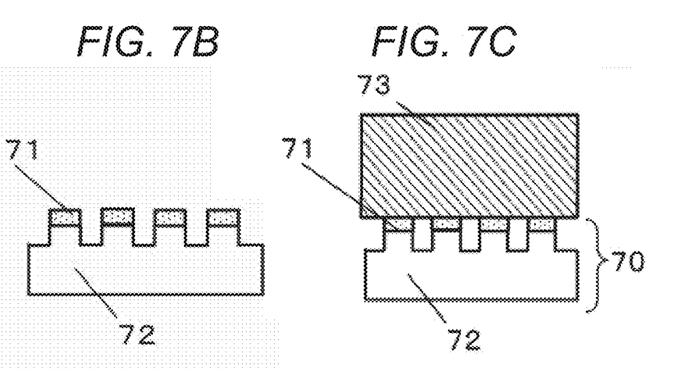
FIGS. 7C to 7E are diagrams showing the steps of producing a group III nitride crystal.

Thereafter, the ScAlMgO$_4$ monocrystalline substrate 72, and the seed layer 71 are patterned. Specifically, as shown in FIG. 7B, a plurality of grooves is formed in the state shown in FIG. 7A, that is, in the flat shape of the ScAlMgO$_4$ monocrystalline substrate 72 and the seed layer 71 shown in FIG. 7A. Here, the ScAlMgO$_4$ monocrystalline substrate 72 and the seed layer 71 are patterned so that the width and the height of the raised portions of the ScAlMgO$_4$ monocrystalline substrate 72 fall in the ranges of Wx and Wy specified above. The patterning is made by a laser process. Preferably, the laser process is performed with a wavelength of 370 nm or less and 190 nm or more.

Figure 8:
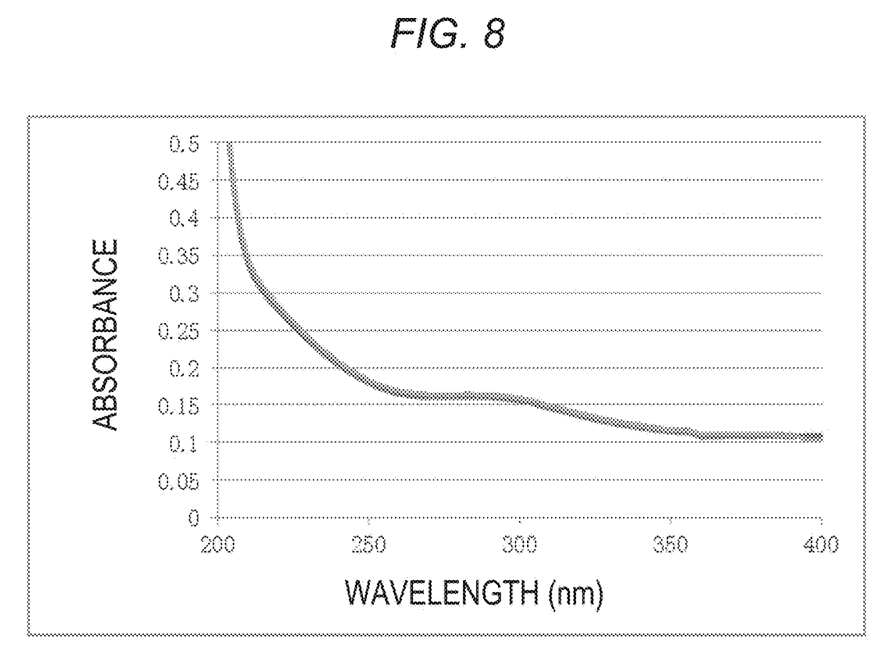
FIG. 8 shows an absorbance spectrum of a $ScAlMgO_4$ monocrystalline substrate (for 100-μm thickness).

FIG. 8 shows an absorbance spectrum of the ScAlMgO$_4$ monocrystalline substrate 72 (for 100-μm thickness). As shown in FIG. 8, the ScAlMgO$_4$ monocrystalline substrate 72 has an absorption region in a wavelength range of 370 nm or less. The absorption region of the group III nitride crystal falls in a wavelength range of 400 nm or less. That is, the $ScAlMgO_4$ monocrystalline substrate 72, and the seed layer 71 can be processed at the same time as shown FIG. 7B when the wavelength of the laser process is 370 nm or less. Because a laser beam is applied from the seed layer 71 side, a laser beam having a wavelength of 370 nm or less may be applied to the $ScAlMgO_4$ monocrystalline substrate 72 after the seed layer 71 is irradiated with a laser beam having a wavelength of 370 nm to 400 nm. The wavelength of the laser beam is desirably 190 nm or more because, below 190 nm, the seed layer 71 and the $ScAlMgO_4$ monocrystalline substrate 72 absorb an excessive quantity of light, and become destroyed. The $ScAlMgO_4$ substrate of the embodiment, specifically, the $ScAlMgO_4$ substrate having the predetermined grooves on the principal surface (epitaxial growth surface) can be produced in the manner described above.

The following describes a method for producing a group III nitride crystal using the $ScAlMgO_4$ substrate of the embodiment. The group III nitride crystal producing method is basically the same as the method described above (the method shown in FIG. 2). The crystal is grown by using a vapor-phase growth method, or a liquid-phase growth method. As shown in FIG. 2, the $ScAlMgO_4$ substrate having the $ScAlMgO_4$ monocrystalline substrate and the seed layer is placed in a crystal growth device, and heated to a temperature of 900° C. or more to start crystal growth. Crystal growth is mediated by an introduced gas or a liquid metal. A group III nitride crystal 73 grows on the seed layer 71 of a $ScAlMgO_4$ substrate 70, as shown in FIG. 7C. The group III nitride crystal 73 can be selectively grown by using different raw material supply methods, and the growth direction may be selected to be vertical or horizontal to the seed layer 71. By selectively growing the group III nitride crystal 73 in a horizontal direction, the group III nitride crystal 73 grown on one raised portion joins the group III nitride crystal 73 grown on the adjacent raised portions. The group III nitride crystals that have grown on the raised portions and horizontally joined each other form a single sheet of group III nitride crystal 73. By further selectively growing the group III nitride crystal upward, the sheet becomes thicker, and forms a bulk of group III nitride crystal 73. The sheet of group III nitride crystal 73 formed in this fashion has a thickness of several hundred micrometers to several millimeters.

The width of the grooves of the $ScAlMgO_4$ substrate 70 is preferably 1 μm or more and 1,000 μm or less. When the groove width is too wide, the group III nitride crystals formed on the raised portions cannot easily join each other.

Figure 7D:
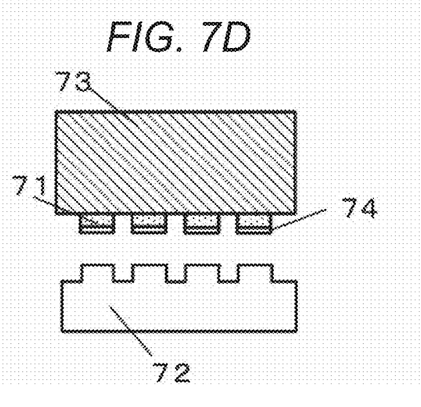

The next step is a cooling process, which is performed to remove the group III nitride crystal 73. Here, the structure experiences internal stress due to the differences in the linear coefficients of expansion of the group III nitride crystal 73, the seed layer 71, and the $ScAlMgO_4$ monocrystalline substrate 72. The $ScAlMgO_4$ monocrystalline substrate 72 has desirable detachability at the (0001) plane and the base portion. With the grooves (irregularities), the break strength of the $ScAlMgO_4$ monocrystalline substrate 72 under internal stress is the smallest at the raised portions. Accordingly, the $ScAlMgO_4$ monocrystalline substrate 72 cleaves at the raised portions before cleavage occurs at the base portion of the $ScAlMgO_4$ monocrystalline substrate 72. For example, when the $ScAlMgO_4$ monocrystalline substrate 72 does not have an off-angle θ, the $ScAlMgO_4$ monocrystalline substrate 72 naturally detaches itself at the raised portions, as shown in FIG. 7D. Here, a remaining $ScAlMgO_4$ single crystal portion 74 can have a considerably thin thickness when the height Wy of the raised portions is optimized. That is, because the $ScAlMgO_4$ substrate 70 has a small break strength at the raised portions, the $ScAlMgO_4$ monocrystalline substrate 72 can break at the raised portions under internal stress. By adjusting the location of breakage, the thickness of the remaining $ScAlMgO_4$ single crystal portion 74 on the group III nitride crystal 73 can be minimized.

Figure 7E:
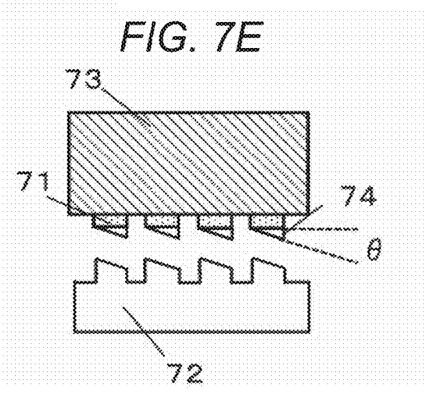

In the present embodiment, the principal surface (epitaxial growth surface) of the $ScAlMgO_4$ monocrystalline substrate 72 has an off-angle θ. The following describes how detachment occurs at the cleaving surface of the $ScAlMgO_4$ monocrystalline substrate 72 when it has an off-angle θ. On the $ScAlMgO_4$ monocrystalline substrate 72 having an off-angle θ, crystals of group III nitride grow on the raised portions of the $ScAlMgO_4$ substrate 70, and join each other to form a single sheet of group III nitride crystal 73 in the manner described above (FIG. 7C). The break strength is also the smallest at the raised portions from internal stresses due to the difference of linear coefficients of expansion is applied upon cooling. Accordingly, the $ScAlMgO_4$ monocrystalline substrate 72 under internal stress can break at the raised portions, in areas near the top surface of the raised portions. Because the epitaxial growth surface of the $ScAlMgO_4$ single crystal has an off-angle θ, detachment occurs in an uniform fashion with the off-angle θ with respect to the top surface of the raised portions of the $ScAlMgO_4$ single crystal, as shown in FIG. 7E. Here, detachment continuously occurs from one side to the other, and ends at the end of the raised portions (across the width Wx). That is, the cleaving surface occurs only in the raised portions, and does not reach the base portion of the $ScAlMgO_4$ monocrystalline substrate 72. This makes it possible to minimize the remaining $ScAlMgO_4$ single crystal portion 74. In the $ScAlMgO_4$ monocrystalline substrate 72, a crack that becomes an initiation point of cleavage tends to occur in the vicinity of the top surface of the raised portions, as described above. A possible explanation for this phenomenon is that the difference of the coefficients of thermal expansion causes thermal stress in the vicinity of the interface between the seed layer 71 and the top surface of the raised portions of the $ScAlMgO_4$ monocrystalline substrate 72, and that the thermal stress concentrates at the raised portions, which occupy a smaller proportion of the interface area than the seed layer 71. In the present embodiment, this is believed to be the reason for the confinement of the cleaving surface within the raised portions.

Other

The foregoing embodiment was described through the case where the $RAMO_4$ substrate includes the $ScAlMgO_4$ monocrystalline substrate. However, the disclosure is not limited to this. The monocrystalline substrate included in the $RAMO_4$ substrate may be any substrate, as long as it is configured from a substantially monocrystalline material represented by general formula $RAMO_4$. In the general formula, R represents one or more trivalent elements selected from Sc, In, Y, and lanthanoid elements (atomic numbers 67 to 71), A represents one or more trivalent elements selected from Fe(III), Ga, and Al, and M represents one or more divalent elements selected from Mg, Mn, Fe(II), Co, Cu, Zn, and Cd. As used herein, "substantially monocrystalline material" refers to a crystalline solid that contains at least 90 at % of a structure represented by $RAMO_4$, and in which an arbitrarily chosen crystal axis has the same orientation in any part of the epitaxial growth surface. Materials with a locally different orientation of the crystal axis, and containing local lattice defects are also regarded as a single crystal. The symbol O means oxygen. R is particularly preferably Sc, M is particularly preferably Mg, and A is particularly preferably Al, as stated above.

The type of the group III nitride crystal epitaxially grown on the $RAMO_4$ substrate is not particularly limited. In the present disclosure, the group III nitride may be a secondary, a ternary, or a quaternary compound containing a group III element (Al, Ga, or In) and nitrogen, for example, a compound represented by general formula $Al_{1-x-y}Ga_yIn_xN$ (wherein x and y satisfy $0 \leq x \leq 1$, $0 \leq y \leq 1$, and $0 \leq 1-x-y \leq 1$). The group III nitride may contain p-type or n-type impurities. The seed layer may be any of the compounds above.

For example, the group III element (Al, Ga, or In) may be replaced, at least in part, with elements such as boron (B), and thallium (Tl). The nitrogen (N) also may be replaced, at least in part, with elements such as phosphorus (P), arsenic (As), antimony (Sb), and bismuth (Bi). The p-type impurity (acceptor) added to the group III nitride may be, for example, a known p-type impurity such as magnesium (Mg), and calcium (Ca). The n-type impurity (donor) may be, for example, a known n-type impurity such as silicon (Si), sulfur (S), selenium (Se), tellurium (Te), oxygen (O), and germanium (Ge). Two or more of the impurity elements (acceptor or donor) may be added at the same time. Crystals of such group III nitrides also can be produced in the manner described above. The foregoing different forms of the disclosure may be appropriately combined, and can exhibit their effects in combination.

The disclosure is applicable to a seed substrate for crystal growth in white LEDs and semiconductor laser diodes used in applications such as lights, and headlights of automobiles.

What is claimed is:

1. A $RAMO_4$ substrate comprising a $RAMO_4$ monocrystalline substrate formed of a single crystal represented by a general formula $RAMO_4$, wherein R represents one or more trivalent elements selected from a group consisting of Sc, In, Y, and a lanthanoid element, A represents one or more trivalent elements selected from a group consisting of Fe(III), Ga, and Al, M represents one or more divalent elements selected from a group consisting of Mg, Mn, Fe(II), Co, Cu, Zn, and Cd, and O represents Oxygen, the $RAMO_4$ monocrystalline substrate having a principal surface with a plurality of grooves, the principal surface having an off-angle θ with respect to a cleaving surface of the single crystal, wherein θ is selected such that upon cleaving a group III nitride crystal formed on the $RAMO_4$ substrate, the cleavage does not extend beyond the raised portions and detachment does not occur at non-grooved regions of the substrate.

2. The $RAMO_4$ substrate according to claim 1, wherein a width Wx at a top surface of a raised portion between the grooves, a height Wy of the raised portion, and the off-angle θ satisfy 1 µm≤Wx≤360 µm, 0.36 µm≤Wy≤1,000 µm, and 0°<θ≤20°, respectively.

3. The $RAMO_4$ substrate according to claim 1, wherein a width Wx at a top surface of a raised portion between the grooves, a height Wy of the raised portion, and the off-angle θ satisfy 16.6 µm≤Wx≤301.1 µm, 0.88 µm≤Wy≤28.7 µm, and 0°<θ≤11.1°, respectively.

4. The $RAMO_4$ substrate according to claim 1, further comprising a group III nitride seed crystal layer on the top surface of the raised portion of the $RAMO_4$ monocrystalline substrate.

5. The $RAMO_4$ substrate according to claim 1, wherein, in the general formula, R is Sc, A is Al, and M is Mg.

6. The $RAMO_4$ substrate according to claim 1, wherein the $RAMO_4$ monocrystalline substrate satisfying tan θ≤Wy/Wx, wherein Wx is a width at a top surface of a raised portion between the grooves, and Wy is a height of the raised portion.

* * * * *